United States Patent
Ma

(10) Patent No.: US 6,929,495 B2
(45) Date of Patent: Aug. 16, 2005

(54) LAND GRID ARRAY CONNECTOR ASSEMBLY WITH RELIABLE BLOCK

(75) Inventor: Hao-Yun Ma, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/994,145

(22) Filed: Nov. 19, 2004

(65) Prior Publication Data

US 2005/0112930 A1    May 26, 2005

(30) Foreign Application Priority Data

Nov. 21, 2003 (TW) ............................... 92220593 U

(51) Int. Cl.[7] ............................................. H01R 13/62

(52) U.S. Cl. ..................................................... 439/331

(58) Field of Search ................................ 439/331, 330, 439/73, 342

(56) References Cited

U.S. PATENT DOCUMENTS 6,692,279 B1 * 2/2004 Ma ............................. 439/331
6,776,625 B2 * 8/2004 Ma ............................. 439/73

* cited by examiner

Primary Examiner—Tho D. Ta
(74) Attorney, Agent, or Firm—Wei Te Chung

(57) ABSTRACT

An LGA connector assembly (1) includes an insulative housing (10), a number of terminals (12) received in the housing, and a metal clip (40) mounted on the housing. The clip is disposed on the housing to press an LGA chip upon the terminals and has two opposite slant sides (42). The housing includes a first sidewall and a second sidewall opposite to the first sidewall. A pair of arcuately spaced protrusions is extended from an outside of the second sidewall. A pair of trapeziform-configuration blocks is formed on an edge of the corresponding protrusions. When the clip presses the LGA chip onto the terminals, the blocks can prevent the clip driving the LGA chip move upwardly relative to the housing, thereby ensuring reliable electrical connection between the LGA chip and the connector assembly.

16 Claims, 4 Drawing Sheets

LAND GRID ARRAY CONNECTOR ASSEMBLY WITH RELIABLE BLOCK

BACKGROUND OF THE INVENTION

1. Field of the Invention

The present invention relates to the art of electrical connectors, and more particularly to a land grid array (LGA) connector assembly provided for mechanically and electrically connecting a land grid array (LGA) chip to a printed circuit board (PCB).

2. Description of the Prior Art

Land grid array (LGA) electrical connectors are widely used in the connector industry for electrically connecting LGA chips to printed circuit boards (PCBs) in personal computers (PCs). Conventionally, an LGA connector mainly comprises an insulative housing, a multiplicity of terminals received therein, a load plate and a cam lever pivotably mounted on two opposite sides of the housing. The housing defines a multiplicity of terminal passageways in a rectangular array, for interferentially receiving corresponding terminals. Due to the very high density of leads arranged on an LGA chip, the LGA chip needs to be precisely seated on the LGA connector. Thus it is difficult to ensure reliable signal transmission between the terminals and the LGA chip.

Referring to FIGS. 4, 5 and 6, a conventional land grid array connector assembly 8 comprises an insulative housing 82, a plurality of terminals 81 received in corresponding passageways 824 of the housing 82, a metal stiffener 84 partly covering and reinforcing the housing 82, a metal clip 88 pivotably attached to an end of the stiffener 84, and a cam lever 86 pivotably mounted to an opposite end of the stiffener 84 for engaging with the cam lever 86. The housing 82 defines four sidewalls and a central cavity disposed between the sidewalls. The central cavity is used for receiving a land grid array (LGA) chip (not shown) therein. A pair of spaced protrusions 822 extends arcuately from an outside of one sidewall. A distal end of the terminal 81 is formed outward from a top surface of the central cavity, for being pressed to engage a corresponding lead of the LGA chip. The clip 88 comprises two first opposite sides 880 and two second opposite sides 881 adjacent to the first sides 880 respectively. A pair of pressing portions 883 each is provided at respective middles of the first sides 880, for pressing the LGA chip electrically engaging with the terminals 81. An engaging portion 884 is extended arcuately from one second side 881, a pair of spaced securing portions 882 extended arcuately from the other second side 881 and pivotably received in corresponding slots 842 of the stiffener 84.

When the LGA chip engages with the connector assembly 8, the clip 88 is rotated upward, the LGA chip is placed in the central cavity of the housing 82. The clip 88 is rotated from a vertical portion to a horizontal portion to make the two opposite first sides 880 of the clip 88 attach on corresponding sides of the LGA chip. The cam lever 86 is rotated to the housing 82 to drive the clip 88 to gradually approach the housing 82 until the pressing portions 881 of the first sides 880 press the LGA chip downwardly to make the leads of the LGA chip contact with the distal ends of the terminals 81. As a result, the mechanical and electrical engagement between the terminals 81 and corresponding leads (not shown) of the LGA chip is attained.

However, when the cam lever 86 is rotated toward the housing 82, a user applies force on an operating portion of the cam lever 86 (not labeled). The force will drive an actuating portion (not labeled) of the cam lever 86 to touch and pressing on the engagement portion 884 of the clip 88 for locking the clip 88. This force is typically along an inclined direction, as indicated by arrow F in FIG. 5. Force F comprises the component force Fx acting along a direction parallel to the housing 82, and the component force Fy acting perpendicularly downwardly relative to force Fx. The effect of force Fx is to make the securing portions 882 of the clip 88 move toward the sidewall 820 of the housing 82 and drive the LGA chip to move toward the sidewall 820 (best seen in FIG. 6). As a result, it is prone to destroy the sidewall 820.

In addition, because the pressing portion 883 is formed in the middle portion of the clip 88, when the pressing portions 883 of the clip 88 press on the LGA chip, only one point of the clip 88 attaches on the LGA chip. The pressing force applied on the LGA chip will generate friction between the LGA chip and the housing 82. The friction is prone to make the LGA chip move relative to the housing 82 in vertical direction and spaces are formed between the leads of the LGA chip and the terminals 81. As a result, the reliability of the mechanical and electrical engagement between the leads of the LGA chip and the terminals 81 is decreased. If this happens, the LGA chip can not be secured between the sidewalls of the housing 82 reliably, and some terminals 81 are prone not to fully engage the corresponding leads of the LGA chip. Uniform engagement between the terminals 81 and the corresponding leads of the LGA chip is destroyed, and even open electrical circuits are liable to establish therebetween. Thus, the reliability of the mechanical and electrical engagement between the terminals 81 and the corresponding leads of the LGA chip is decreased.

Thus, there is a need to provide a new land grid connector assembly that overcomes the above-mentioned problems.

SUMMARY OF THE INVENTION

Accordingly, an object of the present invention is to provide a land grid array (LGA) connector able to ensure that leads of an electrical package electrically connect with corresponding terminals of the LGA connector assembly steadily.

Another object of the present invention is to provide a land grid array (LGA) connector assembly having reliable blocks that are configured to securely protect a housing of the connector assembly from destroying.

To fulfill the above-mentioned object, an LGA connector assembly in accordance with a preferred embodiment comprises an insulative housing, a plurality terminals received in the housing, a metal stiffener engaged with the housing, a metal clip and a cam lever pivotably mounted on two opposite sides of the stiffener. The housing includes a first sidewall, a second sidewall opposite to the first sidewall and two opposite third sidewalls adjacent the first and second sidewalls. The four sidewalls cooperatively define a generally rectangular cavity for receiving an electronic package such as an LGA central processing unit (CPU) therein. A multiplicity of terminal-passages is defined in a portion of the housing under the cavity, for receiving a corresponding number of the terminals therein. A pair of arcuately spaced protrusions is extended outward from an outside of the second sidewall. A pair of blocks is formed on an edge of the corresponding protrusions. The block has a trapeziform configuration. The clip is disposed on the housing to press the CPU upon the terminals. The clip has two opposite first slant sides and two opposite second slant sides adjacent to the first sides respectively. An engaging portion is extended arcuately from one of the first side thereof, a pair of spaced securing portions extended arcuately from the other first side thereof and pivotably received in corresponding slots of the stiffener. The second sides each define a pressing portion at a middle thereof for pressing leads of the LGA chip engaging upon the corresponding terminals. When the LGA chip is mounted onto the housing, the pressing portions of the metal clip press the corresponding portions of the LGA chip to make the leads of the LGA chip electrically connect with the terminals in the housing, the blocks can prevent the clip actuating the LGA chip from moving towards the first sidewall, thereby reliably electrical and mechanical engagement between the LGA chip and the connector assembly is obtained.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
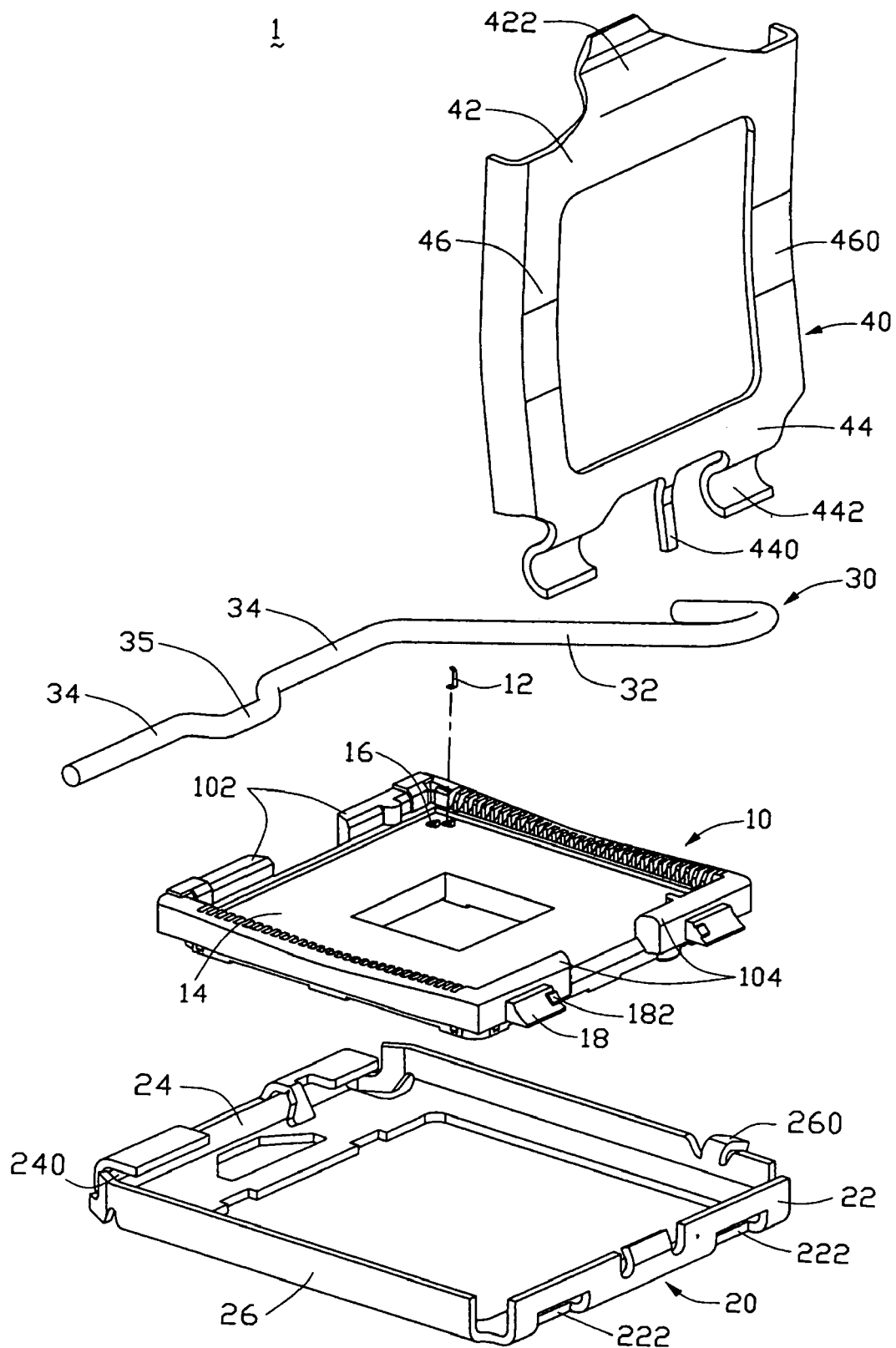
FIG. 1 is an exploded, isometric view of a land grid connector assembly in accordance with a preferred embodiment of the present invention.

FIG. 1 is an exploded, isometric view of a land grid array (LGA) connector assembly 1 in accordance with a preferred embodiment of the present invention. The LGA connector assembly 1 provided for electrically connecting an LGA chip (not shown) to a PCB (not shown) includes an a generally rectangular insulative housing 10, a multiplicity of terminals 12 received in the housing 10, a metal stiffener 20 partly covering and reinforcing the housing 10, a cam lever 30 pivotably attached to an end of the stiffener 20, and a metal clip 40 pivotably mounted to an opposite end of the stiffener 20 for engaging with the cam lever 30.

The housing 10 includes a first sidewall 102, a second sidewall 104 opposite to the first sidewall 102 and two opposite third sidewalls 106 adjacent the first and second sidewalls 102, 104 respectively. The four sidewalls cooperatively define a generally rectangular cavity 14 in a middle thereof for receiving the LGA chip therein. A multiplicity of terminal-passages 16 is defined in a portion of the housing 10 under the cavity 14, for receiving a corresponding number of the terminals 12 therein respectively. Each terminal 12 has a first contacting portion (not labeled) protruding outwardly from a top face of the housing 10, for resiliently electrically contacting a corresponding lead of the LGA chip. A pair of arcuately spaced protrusions 18 is extended from an outside of the second sidewall 104. A block 182 is formed on an edge of the protrusion 18 and has a trapeziform configuration.

The stiffener 20 is substantially rectangular and comprises a pair of lateral sides 26 each having a substantially L-shaped cross-section, a left end 24 having a U-shaped cross-section, and a right end 22 having an L-shaped cross-section. The housing 10 is fittingly received in the stiffener 20. An elongate chamber 240 is defined in the left end 24 of the stiffener 20. A pair of spaced slots 222 is defined in the right end 22 of the stiffener 20. A locking hook 260 extends arcuately from an edge of one of the lateral sides 26 of the stiffener 20.

The lever 30 includes a pair of locating portions 34 pivotably received in the chamber 240 of the stiffener 20, an offset actuating portion 35 between the locating portions 34, and an operating portion 32 extending perpendicularly from an end of one of the locating portions 34. The operating portion 32 is disposed outside of the stiffener 20. When oriented at a horizontal position parallel to the housing 10, the operating portion 32 engages with the locking hook 260.

The clip 40 has a first side 42, a second side 44 opposite to the first side 42 and two opposite third slant sides 46 adjacent the first and second sides 42, 44 respectively. The third sides 46 bent toward the housing 10 and each of the third sides 46 defines a pressing portion 460 bent toward the housing 10 in a middle portion thereof. An engaging portion 422 is extended arcuately from an outside of the first side 42 thereof. A pair of spaced securing portions 442 is extended arcuately from the second side 44 thereof and pivotably received in the slots 222 of the stiffener 20, and a tail 440 formed between the securing portions 412. When the clip 40 is oriented at a horizontal position parallel to the housing 10, the engaging portion 422 of the clip 40 engages with the actuating portion 35 of the lever 30, thereby the driving presses portion 460 pressing the LGA chip on the terminals 12. When the clip 40 is oriented at a vertical position perpendicular to the housing 10, the tail 440 abuts against the stiffener 20 to prevent the clip 40 from being over-rotated.

Figure 2:
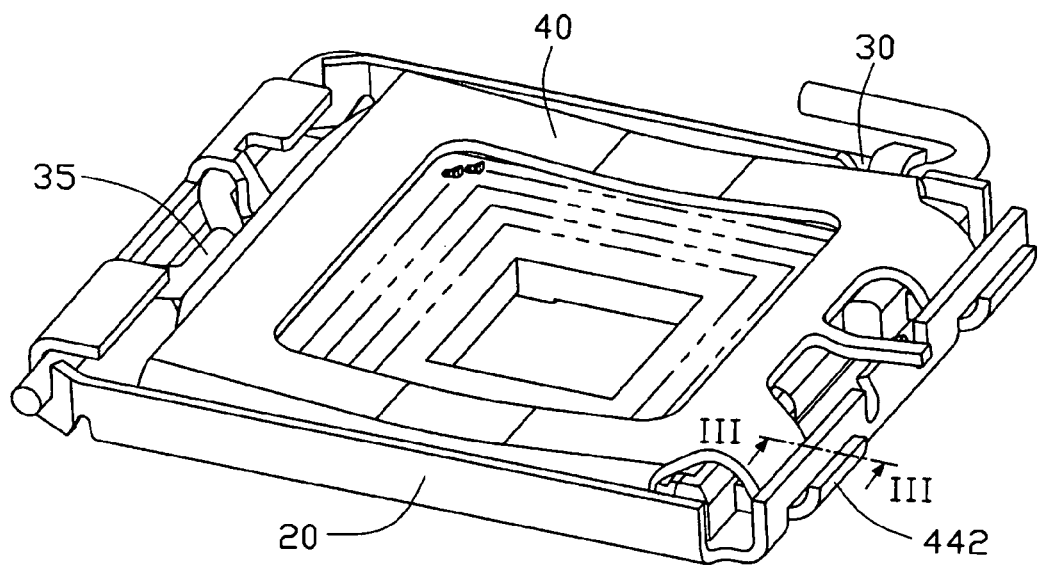
FIG. 2 is an assembled, isometric view of FIG. 1.
Figure 3:
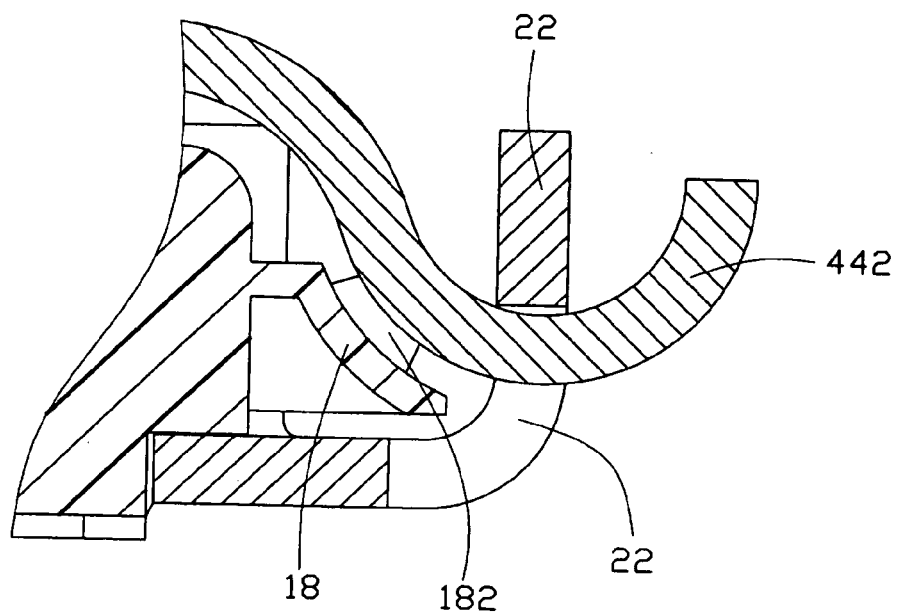
FIG. 3 is a cross-sectional view, taken along line III—III of FIG. 2.
Figure 4:
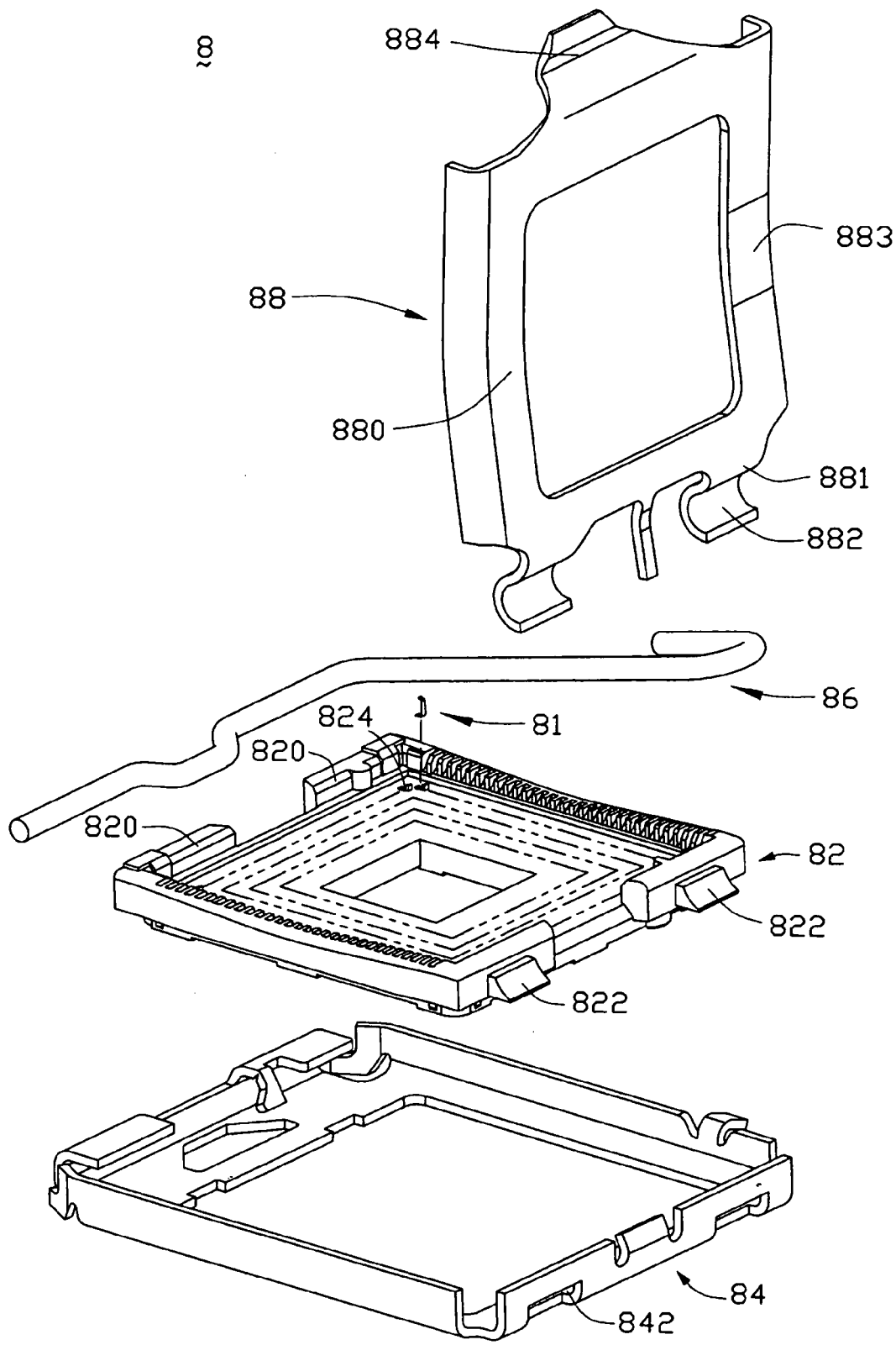
FIG. 4 is an exploded, isometric view of a conventional land grid connector assembly.
Figure 5:
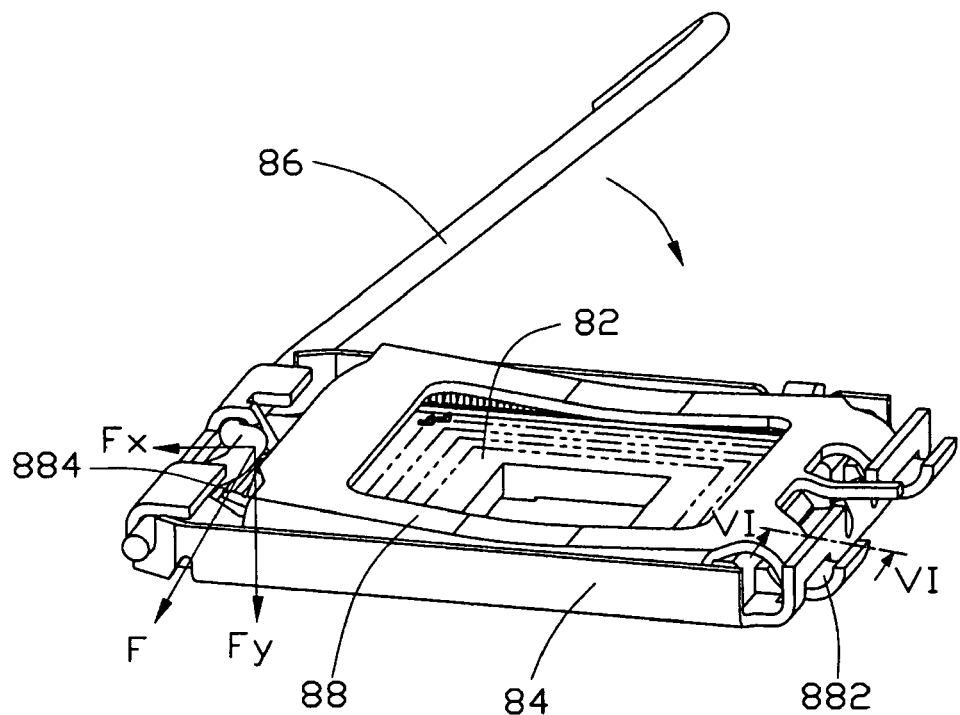
FIG. 5 an assembled view of FIG. 4, but shown a cam lever of the connector assembly is unlocking.
Figure 6:
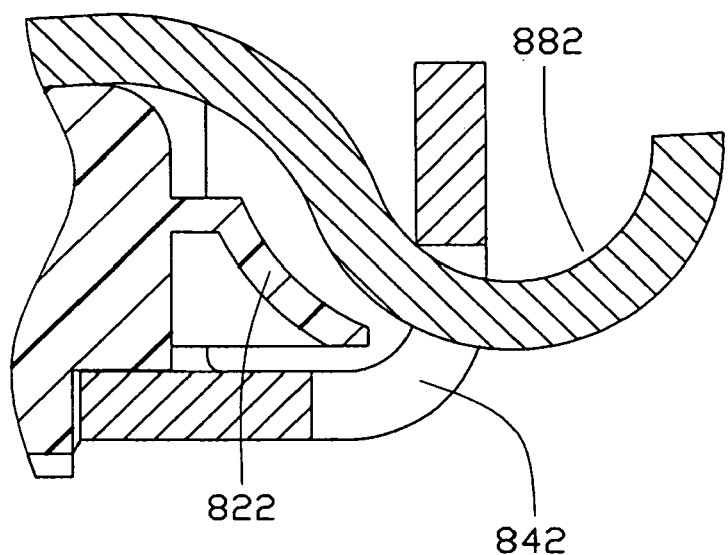
FIG. 6 is a cross-sectional view, taken along line VI—VI of FIG. 5.

Referring to FIGS. 1–3, when the clip 40 is oriented at the vertical position, the LGA chip is positioned in the cavity 14 of the housing 10 to make the leads of the LGA chip contact the corresponding terminals 12 in the housing 10. The clip 40 is rotated from the vertical position to the horizontal position, thereby the pressing portion 460 touches on the LGA chip. The lever 30 is rotated, a user applies force on the operating portion 32 of the lever 30. The force will drive the actuating portion 35 to touch and press on the engagement portion 460 of the clip 40 until the operating portion 32 of the lever 30 being locked in the locking hook 220 of the stiffener 20 in the end for locking the clip 40. This force is typically in an inclined direction, as indicated by arrow F in FIG. 5. Force F is decomposed into the component force Fx acting along a direction parallel to the housing 10, and the component force Fy acting perpendicularly downwardly relative to force Fx. The effect of force Fx is to make the securing portions 442 of the clip 40 move toward the first sidewall 102 of the housing 10 and drive the LGA chip move toward the sidewall 102. When the securing portion 442 moves in the slot 220, the block 182 stops the securing portion 442 moving toward the first sidewall 102. Thus the LGA chip does not press an inner face of the first sidewall 102, thereby the first sidewall 102 being protected from destroying. In addition, the clip 40 is pressed by the lever 30, and the pressing portion 460 of the clip 40 impacts the LGA chip so that the leads of the LGA chip touches on the terminals 12 in the housing 10. The force of the clip 40 operating on the LGA chip can maintain reliably electrical connection between the leads on the LGA chip and the corresponding terminals 12 in the housing 10.

The pressing portion 460 is formed on the clip 40 and can press the LGA chip on the housing 10. The pressing force that the pressing portion 460 operates on the LGA chip is in a vertical direction, and the friction that the LGA chip operating on the sidewall 102 of the housing 10 is in a upward direction. The pressing force that the pressing portion 460 operates on the LGA chip can prevent the LGA chip from moving upwardly, so that the steady electrical connection between the LGA chip and the connector assembly 1 is obtained.

In addition, rigidity of the housing 10 is improved with the stiffener 20 made of rigid material being equipped on the housing 10. So the two opposite ends of the housing 10 will not slope when the clip 40 presses the housing 10 on the center of the housing 10. The force that the housing 10 operates on the clip 40 and the lever 30 will not decrease. The force that the clip 40 operates on the LGA chip will not decrease at same time, so that the steady electrical connection between the leads on the LGA chip and the corresponding terminals 12 in the housing 10 will be ensured.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A land grid array (LGA) connector assembly comprising:
    an insulative housing defining a first sidewall, a second sidewall opposite and a substantially rectangular cavity in a middle thereof, the cavity being adapted for receiving an electronic package therein, a pair of arcuately spaced protrusions extending from an outside of the second sidewall, a block formed on the protrusion;
    a plurality of electrical terminals received in the housing;
    a metal stiffener for partly covering and reinforcing the housing, the stiffener defining a pair of slots in one side thereof;
    a cam lever pivotably received in an end of the stiffener;
    a metal clip pivotably mounted to an opposite end of the stiffener to press the electronic package upon the terminals and having two opposite slant sides, an engaging portion extended arcuately in a middle portion of one side, and a pair of spaced securing portions extended arcuately from an outside of the other side, wherein
    the cam lever engages with the engaging portion to drive the clip to press the package on the terminals so that the securing portion moves in the corresponding slots, the blocks is provided for preventing the package from moving relative to the housing upwardly, for assuring reliable electrical connection between the package and the terminals.

2. The LGA connector assembly as claimed in claim 1, wherein the clip further comprises two second opposite slant sides adjacent to the sides and defines a pressing portion in a middle portion of the second side.

3. The LGA connector assembly as claimed in claim 1, wherein the block has trapeziform configuration.

4. The LGA connector assembly as claimed in claim 3, wherein a tail is defined between the securing portions.

5. The LGA connector assembly as claimed in claim 1, wherein the stiffener comprises a pair of lateral sides each having a substantially L-shaped cross-section, a left end having a U-shaped cross-section, and a right end having an L-shaped cross-section.

6. The LGA connector assembly as claimed in claim 5, wherein the slots are defined in the right end for receiving the securing portions of the clip, and a locking hook extends arcuately from an edge of one of the lateral sides.

7. An land grid array (LGA) connector assembly comprising:
    an insulative housing defining two opposite ends along a front-to-back direction;
    an upward cavity formed in said housing;
    a plurality of conductive terminals disposed in the housing with upper contacting tips extending into the cavity;
    an electronic package received in the cavity and engaged with the corresponding upper contacting tips;
    a metallic stiffener attached to the housing and defining two opposite holding ends along said front-to-back direction aside the corresponding ends of the housing;
    a cam lever pivotally mounted to one of said two holding ends;
    a metallic clip including a pivotal end pivotally mounted to the other of said two holding ends, and a locking end engageable with the lever;
    at least one protrusion formed on the end of the housing which faces the pivotal end of the clip, both said protrusion and said pivotal end being curved in compliance with each other for smooth rotation thereabout; wherein
    a block is formed on said protrusion and faces said pivotal end so as to prevent said pivotal end from moving toward the cam lever when said clip is horizontally seated upon the electronic package and the lever presses downward the locking end.

8. The assembly as claimed in claim 7, wherein said block is integrally formed with the protrusion.

9. The assembly as claimed in claim 7, wherein said block is formed on a curved surface of the protrusion.

10. The assembly as claimed in claim 9, wherein said block only occupies a portion of said curved surface.

11. The assembly as claimed in claim 10, wherein said block is located on an inner side of the protrusion.

12. An land grid array (LGA) connector assembly comprising:
    an insulative housing defining two opposite ends along a front-to-back direction;
    an upward cavity formed in said housing;
    a plurality of conductive terminals disposed in the housing with upper contacting tips extending into the cavity;
    an electronic package received in the cavity and engaged with the corresponding upper contacting tips;
    a metallic stiffener attached to the housing and defining two opposite holding ends along said front-to-back direction aside the corresponding ends of the housing;
    a cam lever pivotally mounted to one of said two holding ends;
    a metallic clip including a pivotal end pivotally mounted to the other of said two holding ends, and a locking end engageable with the lever;
    at least one protrusion formed on the end of the housing which faces the pivotal end of the clip; and
    a block is formed on said protrusion and faces said pivotal end; wherein
    the protrusion and the associated block commonly define a configuration cooperating with the pivotal end to allow said pivotal end to be somewhat freely moveable without regard to the corresponding holding end for assembling/disassembling the pivotal end with regard to the corresponding holding end when said clip is not in a horizontal position while preventing the pivotal end from moving toward or away from the cam lever when said clip is in the horizontal position.

13. The assembly as claimed in claim 12, wherein said block is integrally formed with the protrusion.

14. The assembly as claimed in claim 12, wherein said block is formed on a curved surface of the protrusion.

15. The assembly as claimed in claim 14, wherein said block only occupies a portion of said curved surface.

16. The assembly as claimed in claim 15, wherein said block is located on an inner side of the protrusion.

* * * * *